US012628446B2

(12) United States Patent
Hofrichter

(10) Patent No.: US 12,628,446 B2
(45) Date of Patent: May 12, 2026

(54) INTEGRATED DETECTOR DEVICE AND METHOD OF MANUFACTURING AN INTEGRATED DETECTOR DEVICE

(71) Applicant: ams International AG, Jona (CH)

(72) Inventor: Jens Hofrichter, Horgen (CH)

(73) Assignee: AMS INTERNATIONAL AG, Jona (CH)

( * ) Notice: Subject to any disclaimer, the term of this patent is extended or adjusted under 35 U.S.C. 154(b) by 415 days.

(21) Appl. No.: 18/255,130

(22) PCT Filed: Nov. 18, 2021

(86) PCT No.: PCT/EP2021/082118
§ 371 (c)(1),
(2) Date: May 31, 2023

(87) PCT Pub. No.: WO2022/117354
PCT Pub. Date: Jun. 9, 2022

(65) Prior Publication Data
US 2024/0021652 A1      Jan. 18, 2024

(30) Foreign Application Priority Data

Dec. 4, 2020    (DE) ..................... 10 2020 132 323.9

(51) Int. Cl.
*H10F 39/18*        (2025.01)
*G01T 1/24*        (2006.01)
(Continued)

(52) U.S. Cl.
CPC ......... *H10F 39/1892* (2025.01); *G01T 1/241* (2013.01); *H10F 39/014* (2025.01);
(Continued)

(58) Field of Classification Search
CPC .. H10F 39/1892; H10F 39/014; H10F 39/812; G01T 1/241; H01L 24/80;
(Continued)

(56) References Cited

U.S. PATENT DOCUMENTS 7,955,992 B2    6/2011  Chen et al.
9,847,369 B2    12/2017  El-Hanany et al.
(Continued)

FOREIGN PATENT DOCUMENTS

WO        2017165434 A1    9/2017
WO        2019051056 A1    3/2019
WO        2020003603 A1    1/2020

OTHER PUBLICATIONS

Cabrita, A. (Authorized Officer), International Search Report and Written Opinion dated Apr. 20, 2022, PCT Application No. PCT/EP2021/082118, 9 pages.
(Continued)

*Primary Examiner* — Mamadou L Diallo
(74) *Attorney, Agent, or Firm* — MH2 Technology Law Group LLP

(57)                ABSTRACT

An integrated detector device for direct detection of X-ray photons includes a CMOS body including a substrate portion and a dielectric portion arranged on a main surface of the substrate portion, an integrated circuit in the CMOS body having implants at or above the main surface for forming charge collectors, and a metal structure in the dielectric portion that extends from the charge collectors to a contact surface of the dielectric portion facing away from the substrate portion. The device further includes an absorber portion arranged on the contact surface of the dielectric portion, the absorber portion including an absorber element that is in electrical contact with the metal structure, and an electrode structure that is in direct contact with the absorber element forming an electrical contact. The absorber
(Continued)

element is configured to absorb X-ray photons and generate electrical charges based on the absorbed X-ray photons.

16 Claims, 9 Drawing Sheets

(51) Int. Cl.

| | | |
|---|---|---|
| *H01L 23/00* | (2006.01) | |
| *H10F 39/00* | (2025.01) | |
| *H10W 72/90* | (2026.01) | |
| *H10W 80/00* | (2026.01) | |
| *H10W 90/00* | (2026.01) | |

(52) U.S. Cl.
CPC ......... *H10F 39/811* (2025.01); *H10W 72/941* (2026.01); *H10W 72/951* (2026.01); *H10W 72/952* (2026.01); *H10W 80/211* (2026.01); *H10W 80/327* (2026.01); *H10W 90/792* (2026.01)

(58) Field of Classification Search
CPC . H01L 2224/08145; H01L 2224/80357; H01L 2224/80379; H01L 2224/80896
See application file for complete search history.

(56) References Cited

U.S. PATENT DOCUMENTS

| | | | | |
|---|---|---|---|---|
| 10,263,042 | B2 * | 4/2019 | Sakurai | H10K 85/00 |
| 2005/0104089 | A1 * | 5/2005 | Engelmann | G01J 5/024 |
| | | | | 257/E31.046 |
| 2006/0110844 | A1 | 5/2006 | Lee et al. | |
| 2009/0045346 | A1 | 2/2009 | Von Kanel et al. | |
| 2009/0224162 | A1 | 9/2009 | Inuiya et al. | |
| 2017/0170412 | A1 | 6/2017 | Kanitz et al. | |
| 2019/0280042 | A1 * | 9/2019 | Von Känel | H10F 39/026 |
| 2019/0339398 | A1 | 11/2019 | Karim et al. | |
| 2020/0052148 | A1 * | 2/2020 | Cao | H10F 71/1253 |
| 2020/0124748 | A1 * | 4/2020 | Hofrichter | G01T 1/2019 |
| 2021/0255341 | A1 * | 8/2021 | Abe | H01G 9/0036 |

OTHER PUBLICATIONS

Beller; German Search Report issued in DE Patent Application No. 102020132323.9 dated Jul. 7, 2021, 6 pages.

Yong, C. K. et al.: "Printable organometallic perovskite enables large-area, low-dose X-ray imaging", Nature, Oct. 5, 2017, vol. 550, 10 pages.

Dirin, D. et al.: "Solution-grown CsPbBr3 Perovskite Single Crystals for Photon Detection", Chemistry of Materials vol. 28, pp. 8470-8474 (2016).

He, Y. et al.: "High spectral resolution of gamma-rays at room temperature by perovskite CsPbBr3 single crystals", Nature Communications, vol. 9, 1609 (2018).

Notice of Reasons for Rejection issued in corresponding Japanese Patent Application No. 2023 532355 dated Aug. 6, 2024, with English language translation, 8 pages.

* cited by examiner

INTEGRATED DETECTOR DEVICE AND METHOD OF MANUFACTURING AN INTEGRATED DETECTOR DEVICE

CROSS-REFERENCE TO RELATED APPLICATIONS

The present application is the national stage entry of International Patent Application No. PCT/EP2021/082118, filed on Nov. 18, 2021, and published as WO 2022/117354 A1 on Jun. 9, 2022, which claims priority to German Application No. 10 2020 132 323.9, filed on Dec. 4, 2020, the disclosures of all of which are incorporated by reference herein in their entireties.

FIELD OF THE INVENTION

This disclosure relates to integrated detector devices for direct detection of X-ray photons and to a manufacturing method of such detector devices.

BACKGROUND OF THE INVENTION

State of the art computed tomography, CT, scanners employ scintillators to absorb and convert X-rays that carry medical diagnostic information, for example, to visible light quanta. This visible photons are then, in a second step, detected by conventional silicon photodiodes producing an electrical current. Using the scintillator approach, however, makes it impossible to perform X-ray photon counting, e.g., for determining the X-ray energy spectrum.

Direct detectors, on the other hand, where the X-ray photons are directly detected and transformed into charge without involving scintillators and the conversion to visible light, provide a significantly enhanced spatial resolution, and more importantly, also the capability to resolve the energy of the detected X-ray photons. Moreover, it is desirable that the detectors are fast such as to enable photon counting. Typical decay times are less than 1 microsecond. Some detectors have response times of 100 nanoseconds or less. Most direct detectors are based on absorbing materials such as CdTe or CdZnTe. However, these materials are very challenging to grow and thus are typically characterized by small yields in the order of 10%. Moreover, due to brittleness and susceptibility to thermal shock, integration of these materials require low temperature assembly processes. These downsides limit not only the flexibility in the assembly process, but also the integration density, the choice of material, as well as the readout speed due to parasitics.

It is an object to provide an improved concept of integrated detector devices for direct detection of X-ray photons and their manufacturing that overcome the limitations of existing detectors.

This object is achieved with the subject-matter of the independent claims. Further aspects of the improved concept are the subject-matter of the dependent claims.

SUMMARY OF THE INVENTION

The improved concept is based on the idea of tightly integrating the direct detection elements onto the backend of line of the readout integrated circuit without employing wire bonds or bumps between the direct detection element and the readout circuit. In particular, the improved concept allows for the use of high temperature assembly steps in excess of 100° C. Furthermore, the improved concept enables photon counting via the improved direct interconnect concept between absorber and back-end-of-line, realizing sufficiently fast direct detection with response times of 100 ns or less.

An integrated detector device for direct detection of X-ray photons according to the improved concept comprises a CMOS body comprising a substrate portion and a dielectric portion that are arranged on a main surface of the substrate portion. The integrated detector device further comprises an integrated circuit in the CMOS body having implants at or above the main surface for forming charge collectors. Furthermore, a metal structure in the dielectric portion extends from the charge collectors to a contact surface of the dielectric portion facing away from the substrate portion, and an absorber portion is arranged on the contact surface of the dielectric portion, wherein the absorber portion comprises an absorber element that is in electrical contact with the metal structure. The integrated detector device further comprises an electrode structure that is in direct contact with the absorber element forming an electrical contact. The absorber element is configured to absorb X-ray photons and generate electrical charges based on the absorbed X-ray photons.

Throughout this disclosure, the terms X-ray radiation and X-ray photons refer to high-energy ionizing electromagnetic radiation with an energy in excess of 100 eV up to about 150 keV. This translates to wavelengths of X-ray photons ranging from 10 pm to 10 nm.

The dielectric portion of the CMOS body can be a back-end of line (BEOL) of the detector device that is arranged on a substrate, e.g., a silicon wafer or a chip. The CMOS body comprises a readout integrated circuit for reading out electrical charges formed within the absorber element and providing an electrical signal based on the electrical charges to a processor unit for further processing. Therein, the dielectric portion comprises a layer of a dielectric, such as a silica that comprises a metal structure that can either be a via structure formed from vias and metal interconnects or a metallization level present in the back-end of line, as well as transistors. The latter are formed from the implants at or above the main surface of the substrate portion acting as charge collectors and gates for interconnecting the charge collectors with the absorber element through the metal structure.

The absorber portion is arranged on the CMOS body in a manner such that an absorber element is an electrical contact through, e.g., the metal structure. Alternatively, the absorber element may also be in an electrical contact with the back-end metallization. In particular, the absorber portion is in direct contact with the contact surface of the dielectric portion that comprises an exposed top view for establishing an electrical connection with the absorber element of the absorber portion. The absorber element upon absorption of X-ray quanta generates charges, e.g., electron hole pairs, within the absorber element in a similar manner compared to semiconductor detectors for detecting visible light. The generated charges can be collected by the charge collectors for forming a detection signal.

The electrode structure is arranged in direct contact with the absorber element and is configured to generate a bias or reverse bias high voltage potential enabling the aforementioned charge collection. For example, the electrode structure comprises an electrode formed from a metal layer that is arranged on a top surface of the absorber portion facing away from the CMOS body.

In some embodiments, the integrated detector device is a monolithic semiconductor device.

In other words, these embodiments of the integrated detector device are characterized by its components being integrated together in a single integrated circuit. In particular, the manufacturing of the integrated detector device does not rely on any soldering or alternative ways of connecting different components.

In some embodiments, a material of the metal structure at the contact surface is a catalyst with respect to a reaction educt of a material of the absorber element.

For example, a top via of the metal structure that is a via structure extends to the contact surface is a tungsten via that has favorable nucleation or growth properties regarding a material of the absorber element. Alternatively, a metal layer of the metal structure, e.g. a seed layer, an aluminum layer or a copper layer, can act as a growth site for the material of the absorber element.

In some embodiments, a material of the absorber element is a metal halide persovskite, in particular an inorganic metal halide perovskite such as $CsPbBr_3$, $CsPbI_3$ or $CsPbCl_3$.

Pervoskites are known to be characterized by a favorable x-ray absorption efficiency and a high-power conversion efficiency. Moreover, these materials can be integrated into existing manufacturing processes without the limitation to low temperatures.

In some embodiments, a material of the absorber element is a Thallium halide, in particular inorganic Thallium halides, such as Thallium bromide (TlBr), Thallium iodide (TlI), or Thallium chloride (TlCl).

In some embodiments, the absorber element is in direct physical contact with the contact surface.

Direct physical contact ensures an optimal electrical connection to a top via of the metal structure, for example, at the contact surface or to the metallization lines. Moreover, in this manner, the absorber element can be locally grown from a material with favorable direct x-ray detection properties on nucleation sites, e.g., on the top vias made of a material with favorable nucleation or growth properties such as tungsten, for instance. Alternatively, the material may also be grown on the metallization lines comprised in the BEOL.

In some embodiments, the absorber portion further comprises a passivation that at least partially surrounds the absorber element and an electrode of the electrode structure is arranged on a surface of the passivation facing away from the contact surface.

The passivation can be applied to exposed parts of the contact surface and to the absorber element in order to provide a protective layer. For example, the passivation layer is a polyimide layer, a silicon dioxide layer or a silicon nitride layer. The passivation can be of the same material as a material of the dielectric portion.

An electrode of the electrode structure can be a patterned or structured metal layer applied on the passivation. It can be connected to the absorber element that is buried within the passivation by means of a via or any other type of interconnect. Alternatively, the passivation can be deposited in a manner such that a top surface of the absorber element is free of any passivation in order to be brought into direct contact with an electrode.

In some embodiments, the contact surface comprises first bond pads and the absorber portion comprises a bonding surface having second bond pads that are in electrical contact with the absorber element. Therein, the first bond pads are bonded to the second bond pads via a direct bonding process.

In some circumstances it can be desirable to separately manufacture the CMOS body and the absorber portion. For example, the manufacturing of the absorber portion is characterized by temperature limitations that are not compatible with the manufacturing of the CMOS body. In other words, these embodiments are suitable if the manufacturing process of the absorber portion is not a CMOS compatible process. For example, the bond pads are made of titanium or a titanium compound.

In some embodiments, the integrated detector device is free of connection elements such as solder bumps between the CMOS body and the absorber portion.

These embodiments are characterized by their direct integration. The entire detector device including backend and frontend components can be manufactured in a single process without the need for interconnecting different portions via soldering, potentially generating further downsides such as additional signal loss channels due to improper electrical connections.

In some embodiments, the integrated detector device is free of CdTe and CdZnTe.

The brittleness and susceptibility to thermal shocks renders these materials less suitable for integration as they require the manufacturing process to be a low temperature assembly process. However, if the manufacturing process does not need to fulfil full CMOS compatibility, established x-ray absorber materials such as CdTe and CdZnTe can be suitable choices for a detector device according to the improved concept.

The aforementioned object is further solved by a medical device, in particular a medical imaging device, comprising an integrated detector device according to one of the embodiments described above. For example, the medical imaging device can be a computed tomography scanner with an integrated detector device for enabling photon counting detection mechanisms. To enable photon counting, a fast response of the detector material is required, which is supported by the short interconnection scheme disclosed in the embodiments. Alternative applications include industrial CT devices as well as airport security screening devices such as baggage screening, for instance.

The aforementioned object is further solved by a method of manufacturing an integrated detector device for direct detection of X-ray photons. The manufacturing method comprises forming a CMOS body by arranging a dielectric portion onto a main surface of a substrate portion, and forming an integrated circuit in the CMOS body having implants at or above the main surface for forming charge collectors. The method further comprises forming a metal structure in the dielectric portion that extends from the charge collectors to a contact surface of the dielectric portion facing away from the substrate portion. The method further comprises arranging an absorber portion on the contact surface of the dielectric portion by forming an absorber element that is in electrical contact with the metal structure. The method further comprises providing an electrode structure that is in direct contact with the absorber element forming an electrical contact. The absorber element is configured to absorb X-ray photons and generate electrical charges based on the absorbed X-ray photons.

In some embodiments of the method, forming the metal structure comprises providing a via structure having a top via that is made of tungsten at the contact surface.

Tungsten can be shown to possess favorable nucleation or growth properties regarding suitable material choices for the absorber element of a detector device according to the improved concept, such as perovskites, for instance.

In some further embodiments, forming the absorber element comprises patterning, structuring and/or polishing of a material of the absorber element.

To define individual absorber elements from a layer of absorber material deposited onto the contact surface, e.g. an etching or ion milling process can be performed to bring the absorber elements into their desired final shape.

In some embodiments, arranging the absorber portion further comprises forming a passivation that at least partially surrounds the absorber element, and providing the electrode structure comprises arranging an electrode on a surface of the passivation facing away from the contact surface.

The passivation can be applied to exposed parts of the contact surface and to the absorber element in order to provide a protective layer. For example, the passivation layer is a polyimide layer, a silicon dioxide layer or a silicon nitride layer. The passivation can be of the same material as a material of the dielectric portion.

An electrode of the electrode structure can be a patterned or structured metal layer applied on the passivation. It can be connected to the absorber element that is buried within the passivation by means of a via or any other type of interconnect. Alternatively, the passivation can be deposited in a manner such that a top surface of the absorber element is free of any passivation in order to be brought into direct contact with an electrode.

In some further embodiments, arranging the absorber portion comprises growing, in particular selectively growing, a material of the absorber element on the contact surface, wherein a region of the metal structure at the contact surface acts as a nucleation site.

In some embodiments, arranging the absorber portion comprises performing a direct bonding process or a hybrid bonding process between the absorber portion and the CMOS body.

In some embodiments, the manufacturing method is a fully CMOS compatible process.

This means that the entire manufacturing process is compatible with the required temperatures, e.g., up to 400° C., of a CMOS process. In contrast, prior art solutions due to the absorber material are often limited to temperatures of less than 100° C. for the entire manufacturing process.

In some embodiments, arranging the absorber portion comprises depositing a dielectric layer on the contact surface, patterning and structuring the dielectric layer to form a to form a trench within the dielectric layer, and depositing the absorber element within the trench.

Further embodiments of the method become apparent to the skilled reader from the embodiments of the integrated detector device as described above.

In summary, the improved concept enables a tight integration of direct detection elements onto the back-end of line of the readout integrated circuit. Moreover, detector devices according to the improved concept are free of wire bonds or bumps between the direct detection element and the readout IC with the entire manufacturing process being capable to use high-temperature assembly steps in excess of 100° C. Additionally, the proposed concept enables very-low parasitic interconnects supporting fast operation, which is a pre-requisite for, e.g., photon counting applications.

BRIEF DESCRIPTION OF THE DRAWINGS

The following description of figures of exemplary embodiments may further illustrate and explain aspects of the improved concept. Components and parts of the integrated detector device with the same structure and the same effect, respectively, appear with equivalent reference symbols. Insofar as components and parts of the integrated detector device correspond to one another in terms of their function in different figures, the description thereof is not repeated for each of the following figures.

In the Figures.

DETAILED DESCRIPTION

Figure 1:
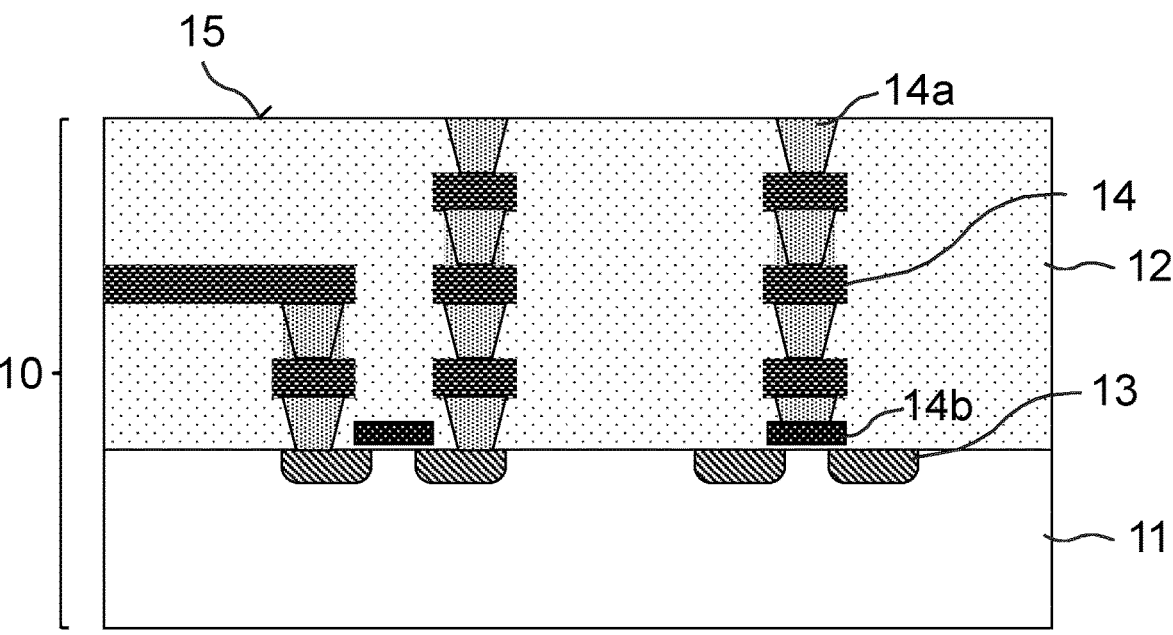
FIG. 1 shows an intermediate product of an exemplary embodiment of an integrated detector device according to the improved concept.

FIG. 1 shows a cross-sectional schematic view of an intermediate product of an exemplary embodiment of an integrated detector device according to the improved concept. More specifically, FIG. 1 shows a CMOS body 10 as a possible starting product for further manufacturing steps illustrated in the following drawings.

The CMOS body 10 comprises a substrate portion 11, which is a silicon wafer or silicon chip, for instance. On a main surface of the substrate portion 11, a dielectric portion 12 is arranged. For example, the dielectric portion 12 comprises a silica such as silicon dioxide or silicon nitride. The dielectric portion 12 is characterized by a contact surface 15 on a side of the dielectric portion 12 facing away from the substrate portion 11. The contact surface 15 is a surface formed by a step of chemical-mechanical polishing, CMP, or an etch-back process, for instance.

The CMOS body 10 comprises a readout integrated circuit formed from implants 13 at or above the main surface of the substrate portion 11, a metal structure 14 and optionally further elements such as metal interconnects. In this embodiment, the metal structure 14 comprises a via structure having vias and metal layers. Such via structures are common structures in the field and are not further detailed in this disclosure. The metal structure 14 in this embodiment further comprises a gate element 14b arranged in between the implants 13 and vias of the metal structure 14, with the implants 13 and the gate element 14b effectively forming a transistor element. The metal structure 14 in this embodiment is further characterized by a top via 14a that extends to the contact surface 15 and is a tungsten via, for example. The metal structure 14 interconnects the charge collectors formed by the implants 13 with the contact surface 15. The dielectric portion 12 can be regarded a backend-of-line, BEOL, of the integrated detector device. A material of the metal structure 14 at the contact surface 15 is a catalyst acting as a nucleation site of a material of the absorber element (21) or its educts.

Figure 2A:
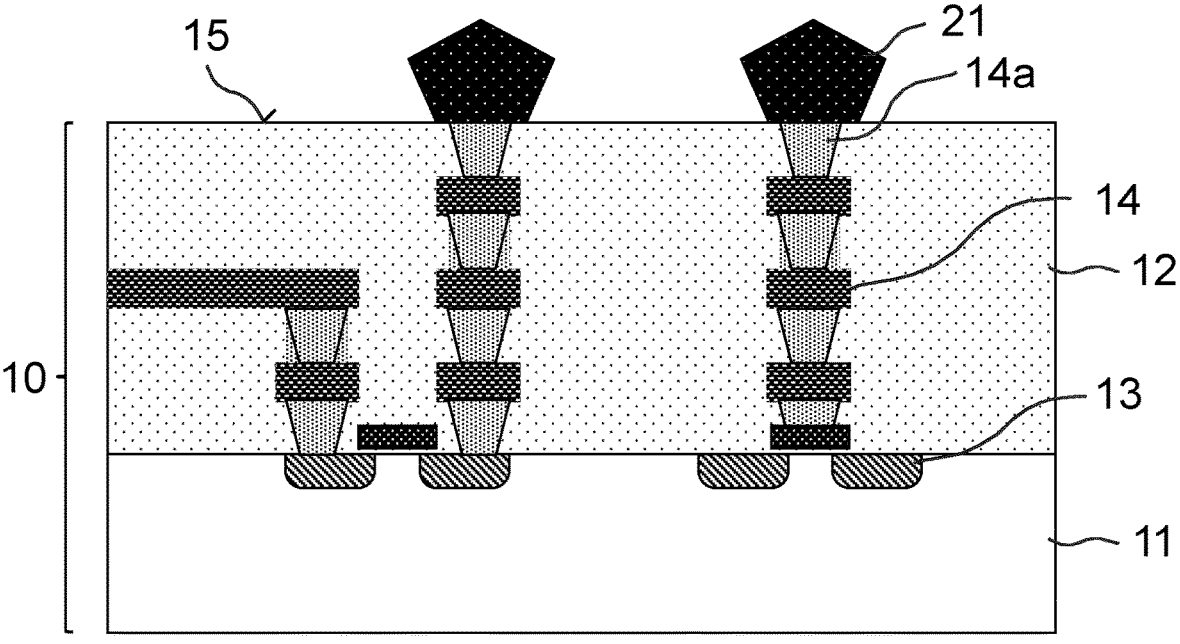
FIGS. 2A to 2C illustrate processing steps of an exemplary embodiment of the method for manufacturing an integrated detector device.
Figure 2B:
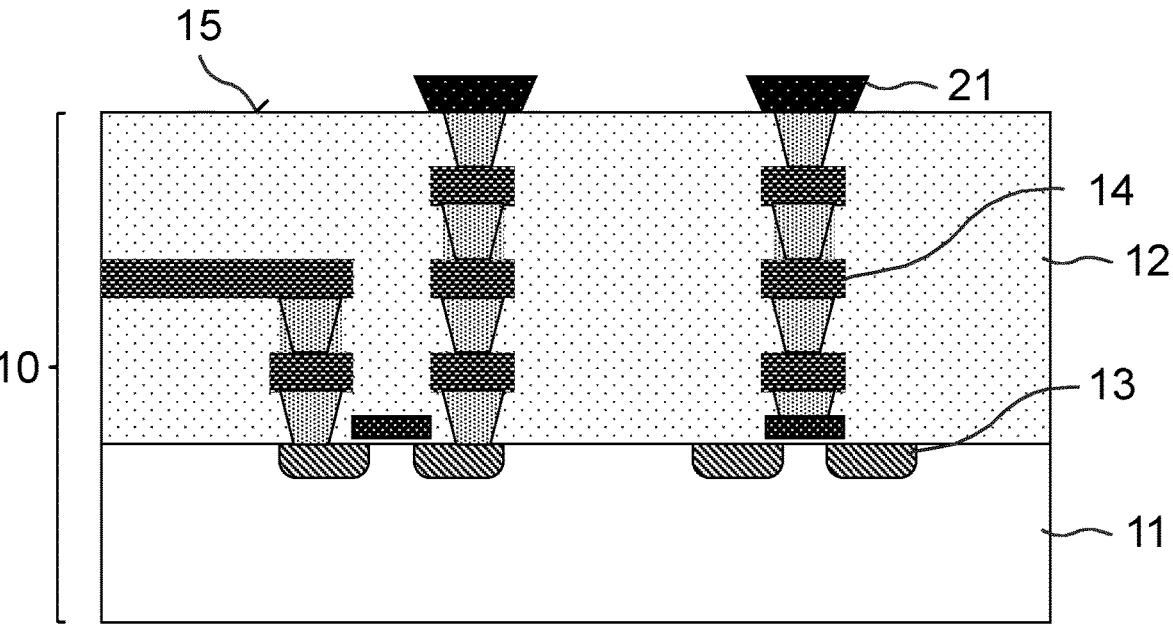
Figure 2C:
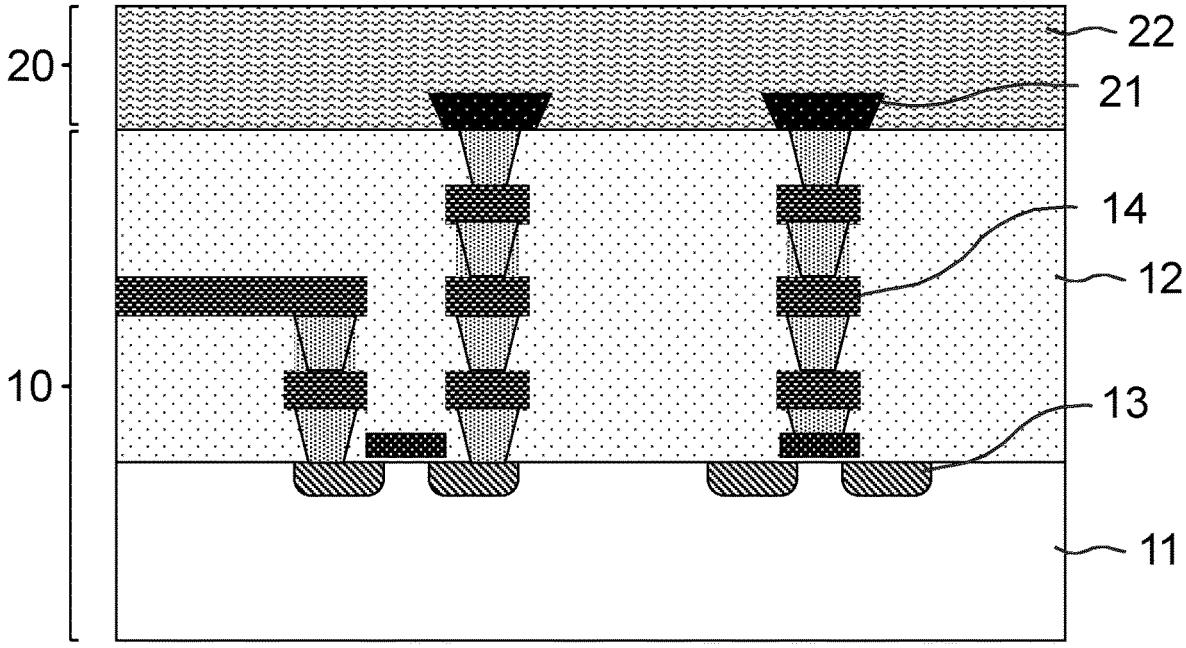

FIGS. 2A to 2C show cross-sectional schematic views of further intermediate products of the integrated detector device according to a first embodiment of the manufacturing method based on the CMOS body 10 of FIG. 1 as a starting product. In a first step illustrated in FIG. 2A, an absorber element 21 is deposited onto each of the top vias 14a. More specifically, absorber material is selectively grown on the top vias 14*a* that act as nucleation sites. In other words, a material of the top via 14*a*, e.g. tungsten, is a catalyst with respect to a reaction educt of a material of the absorber element 21. For example, the absorber element 21 is made of a metal-halide perovskite, in particular an inorganic metal-halide perovskite such as CsPbBr$_3$. Alternatively, the absorber element 21 is made of other materials or compounds that absorb and directly convert x-ray photons to electrical charges.

Subsequently, FIG. 2B, after the growth of the absorber elements 21 shown in the previous figure, illustrates further processing performed on the absorber material. More specifically, in this step absorber material is patterned and structured, or alternatively polished, in order to achieve the desired finalized shape of the absorber elements 21 on the contact surface 15.

For finalizing the absorber portion 20, in this embodiment of the method, as illustrated in FIG. 2C, an overcladding or passivation 22 is realized by depositing a passivation material, e.g. silicon dioxide, silicon nitride or a polyimide, onto the contact surface 15 and the absorber elements 21 in a manner that both the contact surface 15 and the absorber elements 21 are covered by the passivation 22.

Figure 3A:
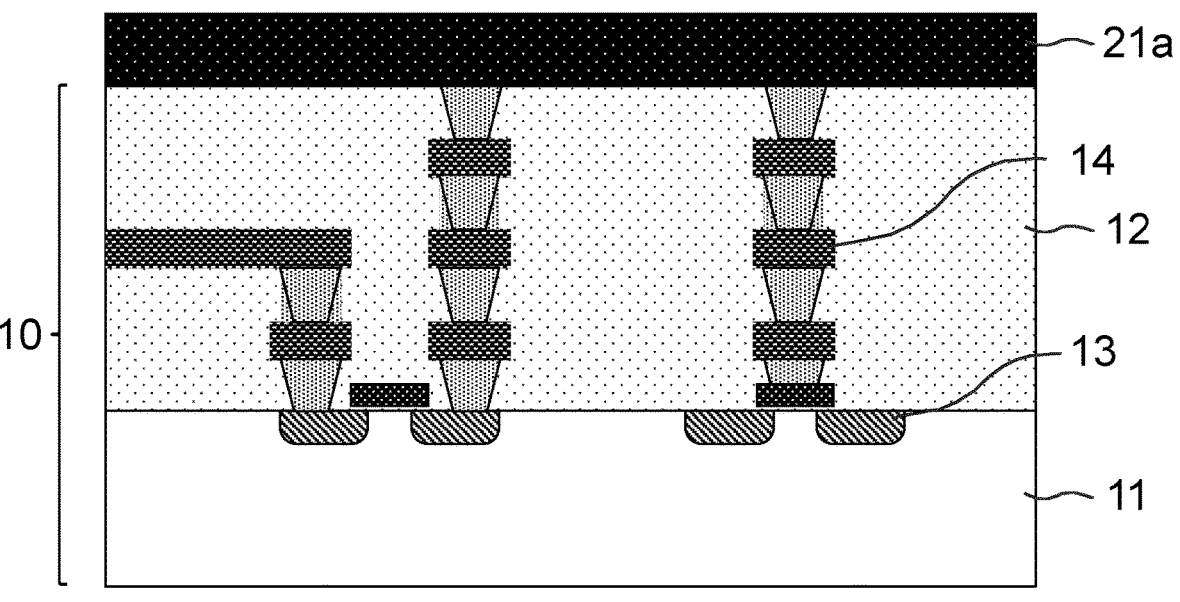
FIGS. 3A to 3C illustrate processing steps of a further exemplary embodiment of the method for manufacturing an integrated detector device.
Figure 3B:
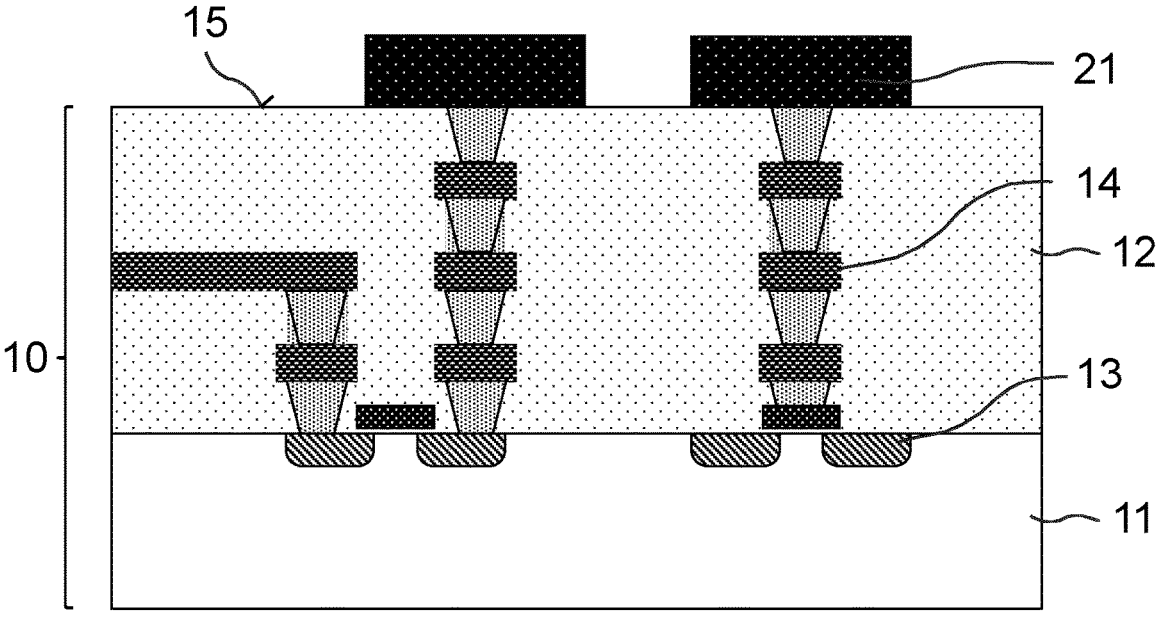
Figure 3C:
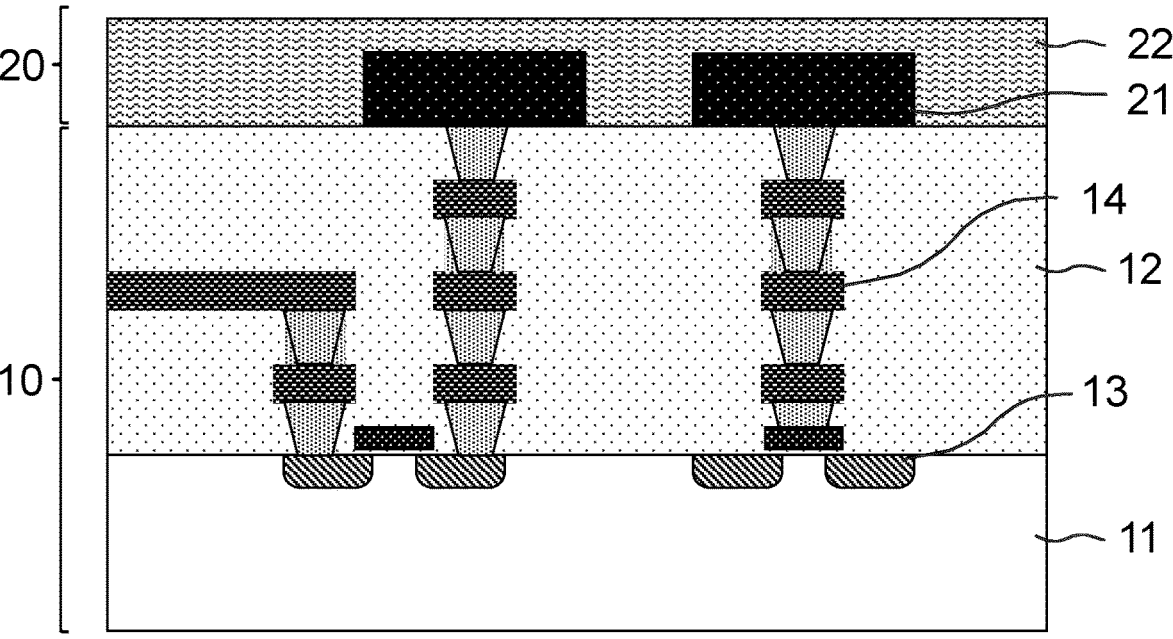

FIGS. 3A to 3C show cross-sectional schematic views of further intermediate products of the integrated detector device according to a second embodiment of the manufacturing method based on the CMOS body 10 of FIG. 1 as a starting product. In this embodiment of the manufacturing method, FIG. 3A illustrates the layered growth of the absorber material across all, or substantially all, of the contact surface 15. Also in this embodiment, the absorber material can be a metal-halide perovskite, in particular an inorganic metal-halide perovskite, such as CsPbBr$_3$ for instance. Alternatively, the absorber element 21 can be of an alternative material that is suitable as an x-ray absorber and of the described layered growth.

FIG. 3B illustrates a subsequence step, in which the absorber material is patterned and/or structured in order to form the finalized absorber elements 21 on each top via 14*a* of the metal structure 14. Analogous to the first embodiment of the manufacturing method, as illustrated in FIG. 3C, a passivation 22 is applied to the exposed portions of the contact surface 15 and the absorber elements 21, hence finalizing the absorber portion 20 in this embodiment.

Figure 4A:
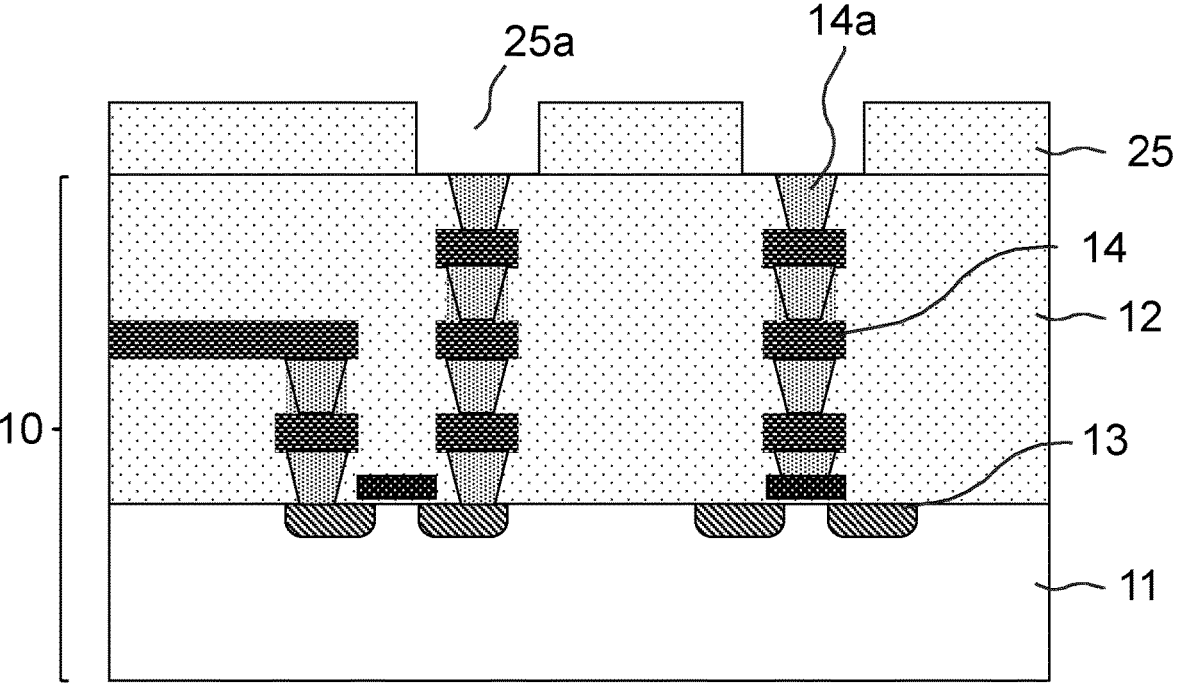
FIGS. 4a to 4C illustrate processing steps of a further exemplary embodiment of the method for manufacturing an integrated detector device.
Figure 4B:
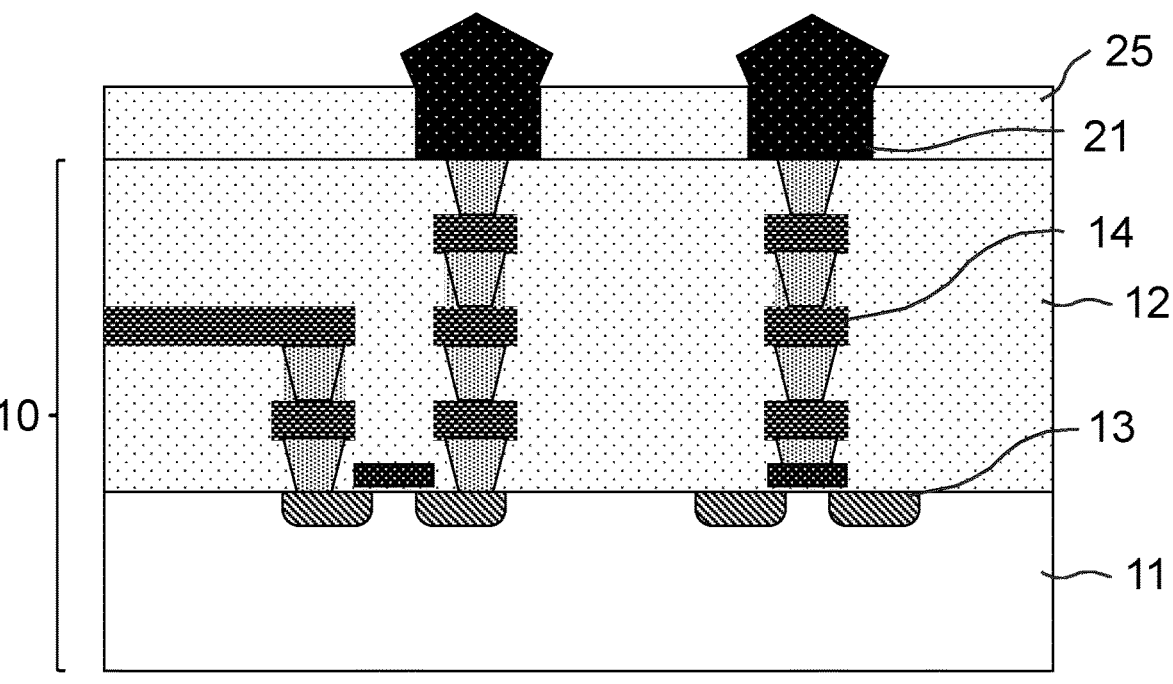
Figure 4C:
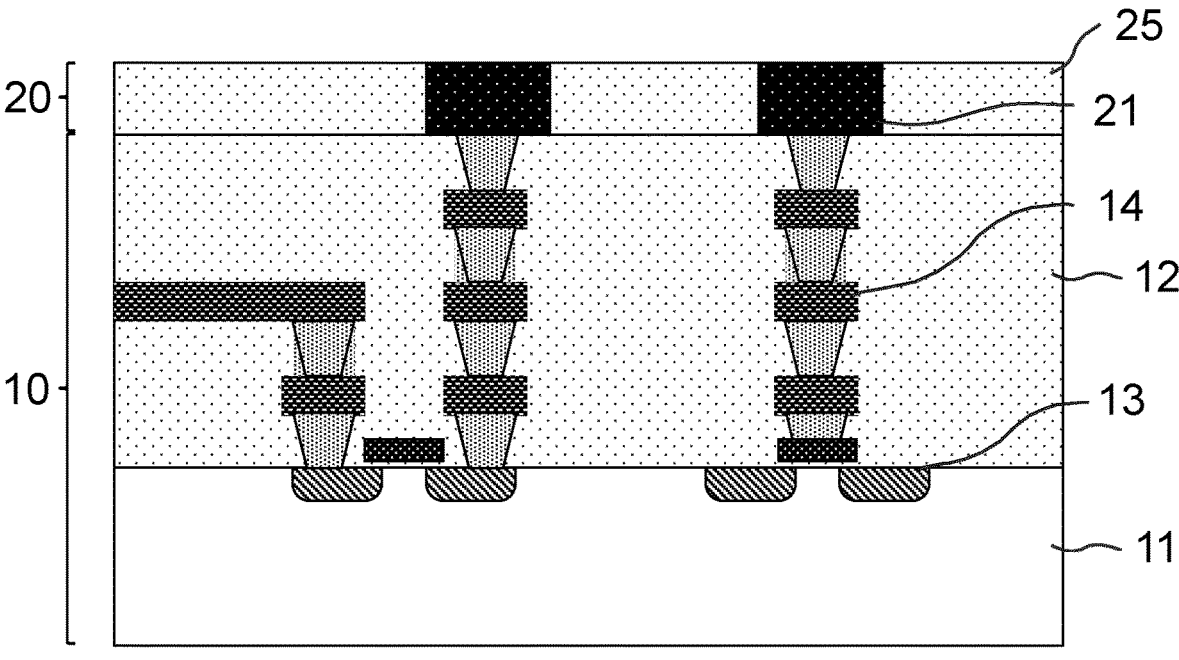

FIGS. 4A to 4C show cross-sectional schematic views of further intermediate products of the integrated detector device according to a third embodiment of the manufacturing method based on the CMOS body 10 of FIG. 1 as a starting product. In this embodiment of the manufacturing method, as illustrated in FIG. 4A, a dielectric layer 25, e.g., a silicon dioxide layer or a silicon nitride layer, is deposited onto the contact surface 15 of the CMOS body 10 of FIG. 1. A material of the dielectric layer 25 can be the same as a material of the dielectric portion 12. Subsequently, the dielectric layer 25 is structured and/or patterned, e.g. via an etching process, for forming trenches 25*a* within the dielectric layer 25 that expose portions of the contact surface 15, at which top vias 14A of the metal structure 14 are located.

Subsequently, FIG. 4B illustrates the growth of the absorber material in the trenches 25*a* of the dielectric layer 25. Analogous to the previously described embodiments of the manufacturing method, the absorber material can be either deposited or selectively grown within the trenches 25*a* on the top vias 14A acting as nucleation sites.

FIG. 4C illustrates the finalization of the absorber portion 20 through planarization of a top surface, e.g. by CMP or by non-selective etch-back.

Figure 5A:
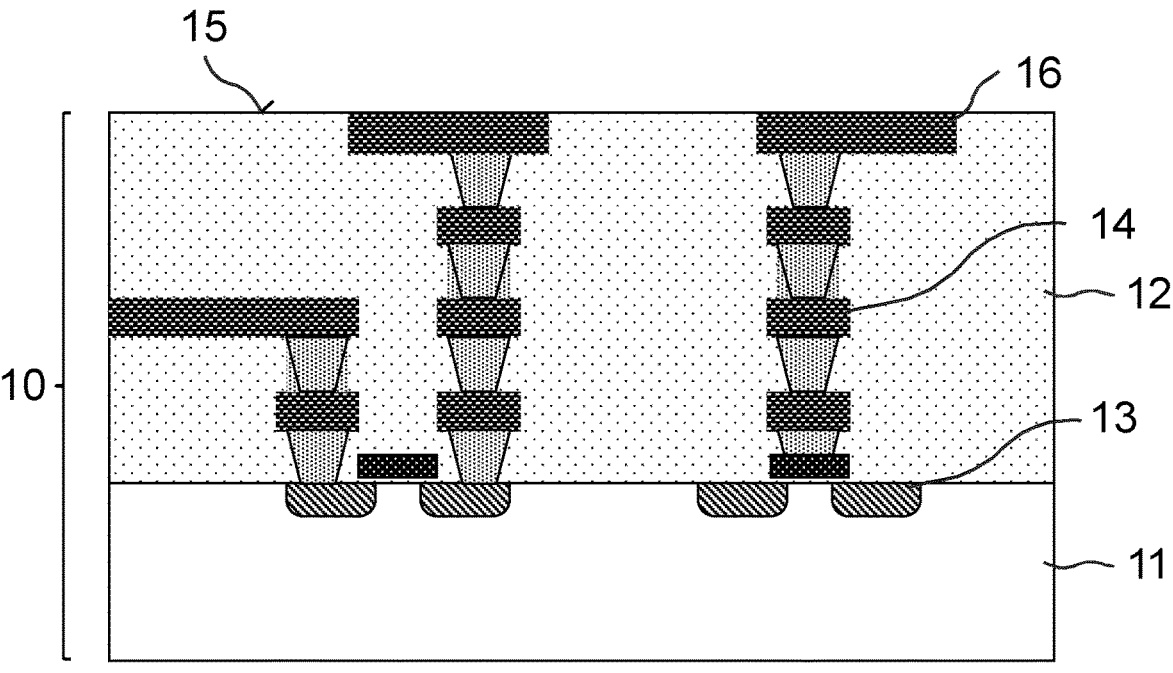
FIGS. 5A to 5F illustrate processing steps of a further exemplary embodiment of the method for manufacturing an integrated detector device.

FIGS. 5A to 5F show cross-sectional schematic views of further intermediate products of the integrated detector device according to a third embodiment of the manufacturing method based on the CMOS body 10 of FIG. 1 as a starting product. FIG. 5A illustrates the intermediate product of the integrated detector device 1 after the formation of first bond pads 16 at the contact surface 15 of the dielectric portion 12. For example, the first bond pads 16 are hybrid bond pads made of titanium or a titanium compound, for instance. For efficient bonding, the contact surface 15 at this step is characterized by a RMS surface roughness of less than 1 nm.

Figure 5B:
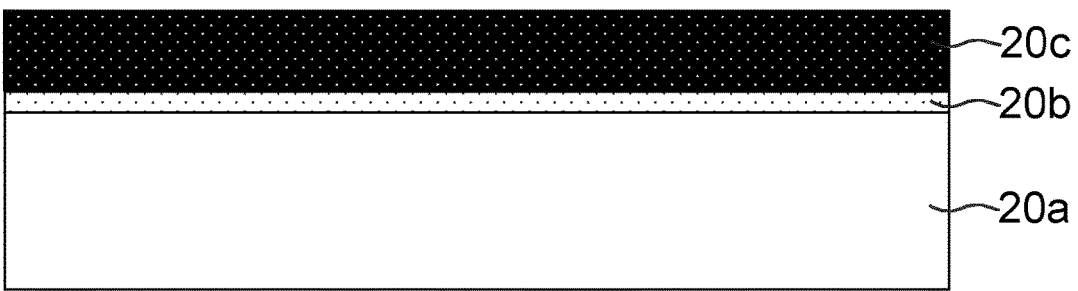
Figure 5C:
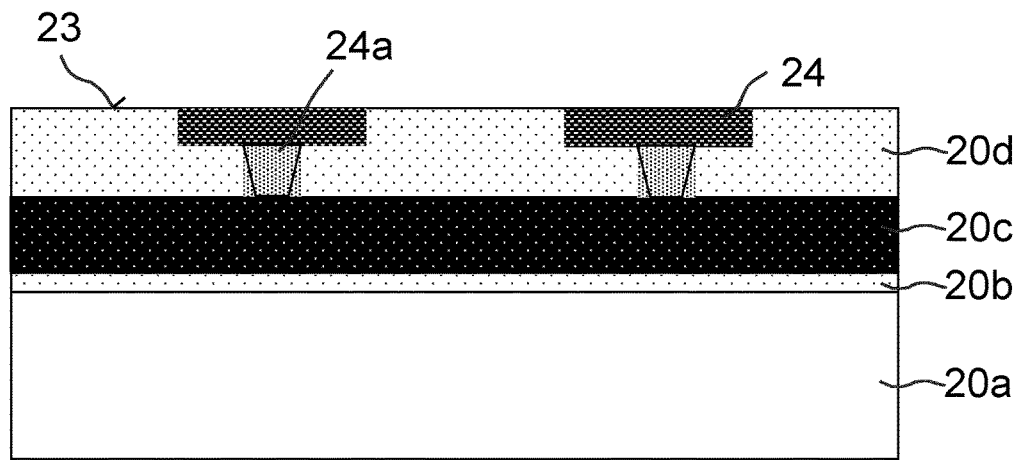

FIGS. 5B and 5C illustrate the separate manufacturing of the absorber portion 20. As shown in FIG. 5B, an insulator layer 20*b* and a layer of the absorber material 20*c* are deposited on a main surface of a handling substrate 20*a*, e.g. a silicon wafer or chip. In alternative embodiments not shown, the absorber material layer 20*c* is deposited directly onto the handling substrate 20*a* without any insulator material in between. The insulator material 20*b* can act as a growth catalyst for the absorber material layer 20*c*, for example.

FIG. 5C shows a subsequent intermediate product of the absorber portion 20, in which second bond pads 24 are formed within a dielectric layer 20*d* that is deposited onto the absorber material layer 20*c*. The second bond pads 24 are likewise hybrid bond pads made of titanium or a titanium compound, for instance. Moreover, the bonding surface 23 is also characterized by a RMS surface roughness of less than 1 nm. The second bond pads 24 can be electrically connected to the absorber material layer 20*c* using vias 24*a*.

Alternatively, the second bond pads 24 can be in direct physical and electrical contact with the absorber material layer 20*c*.

Figure 5D:
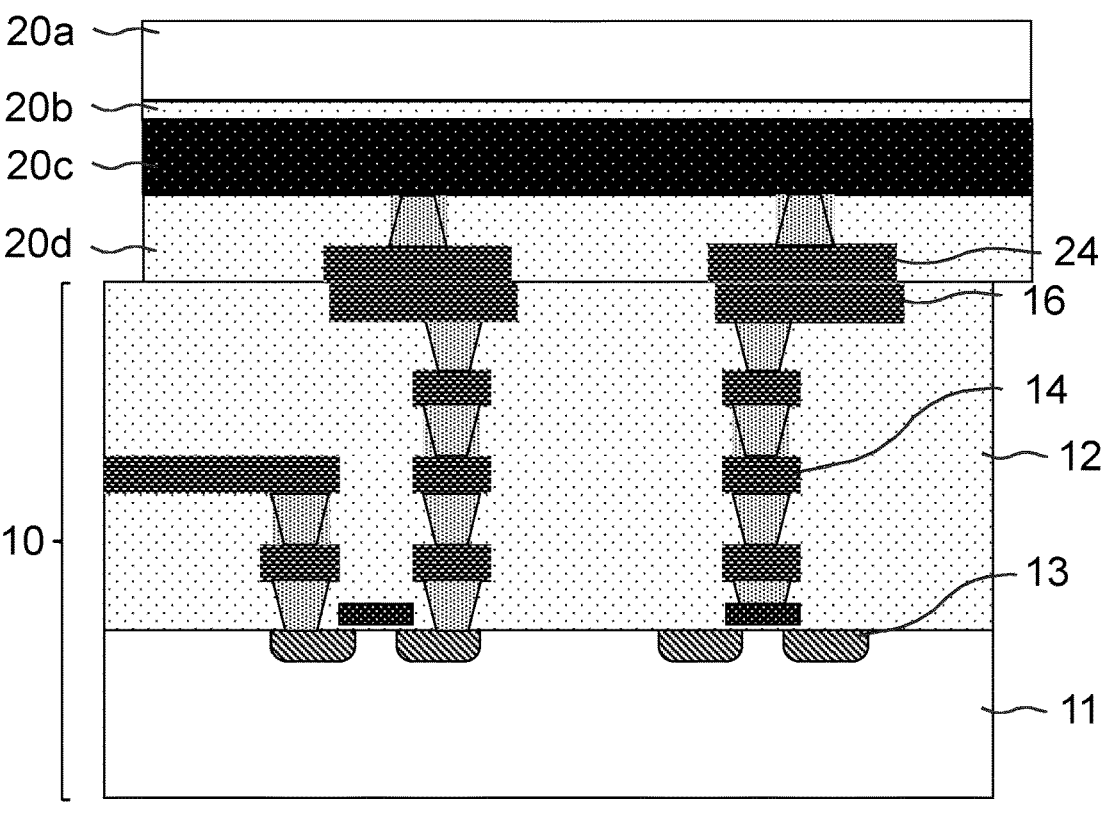

FIG. 5D shows an intermediate product of the integrated detector device 1 after bonding the intermediate product of the absorber portion 20 of FIG. 5C to the CMOS body 10 of FIG. 5A. For example, the bonding is performed via a hybrid or direct bonding process in a manner such that the first bond pads 16 and the second bond pads 24 are brought in direct physical and electrical contact. In particular, no further connection elements such as sold-out bumps are located between the first and second bond pads 16, 24.

Figure 5E:
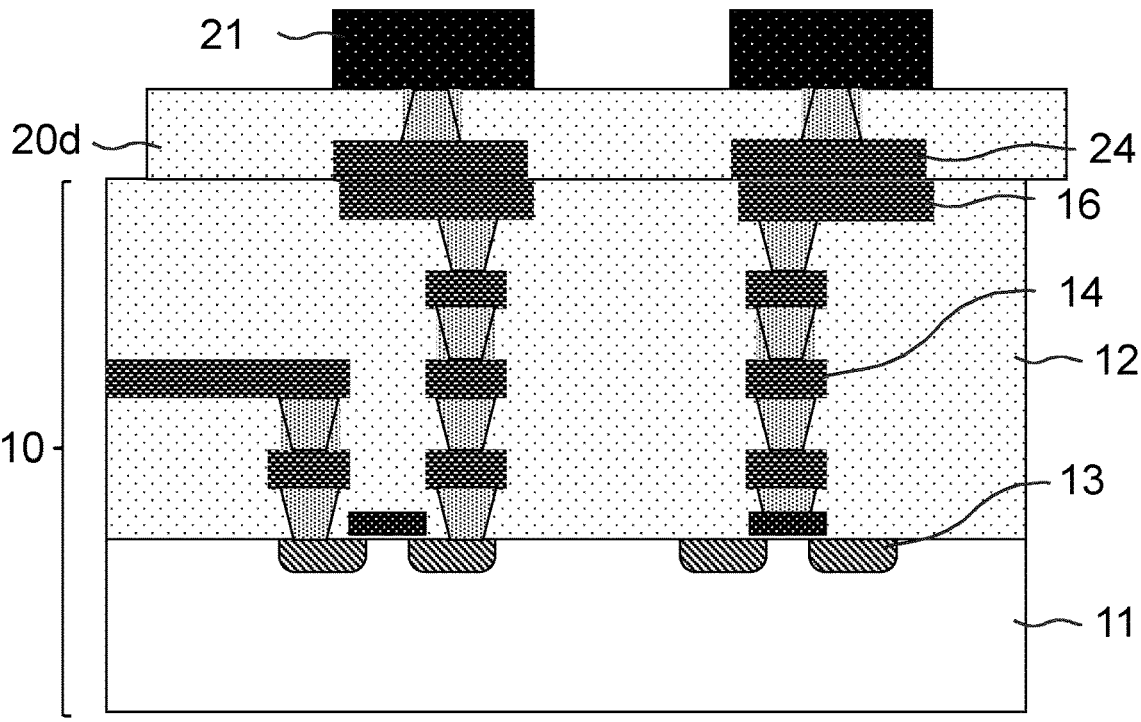
Figure 5F:
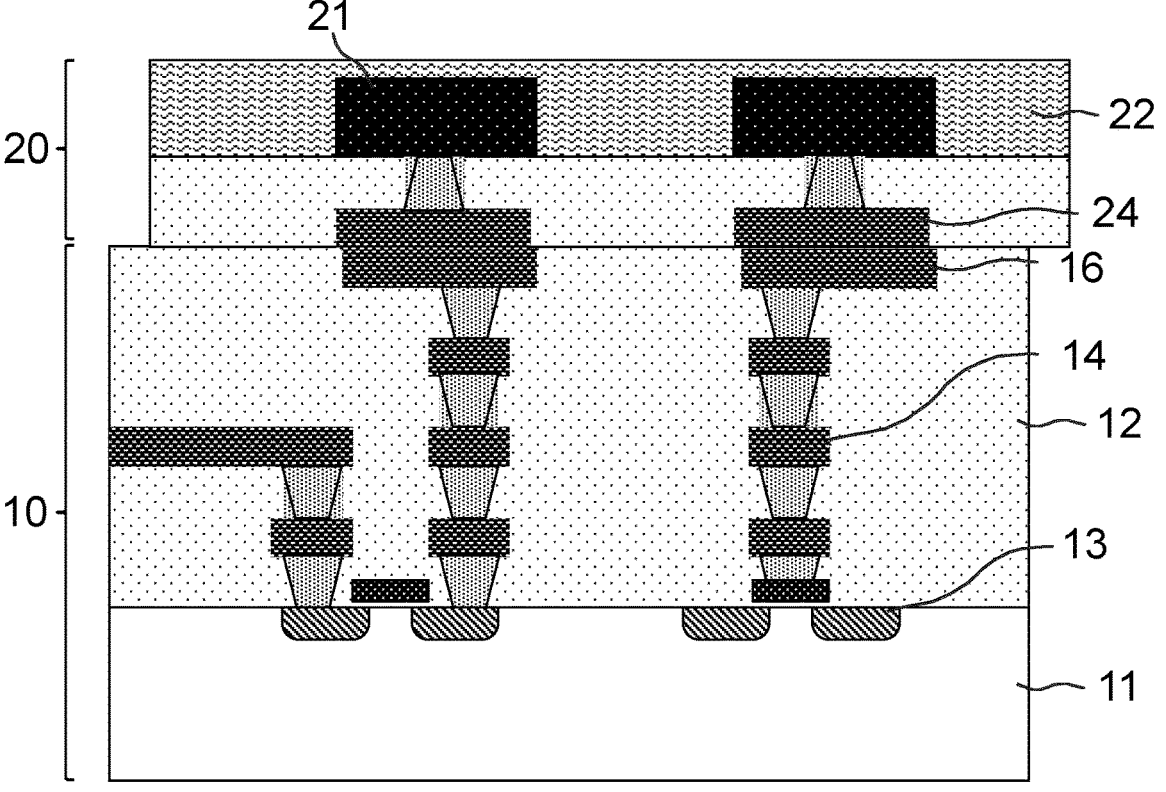

Subsequently, as illustrated in FIG. 5E, first the handling substrate 20*a* and the optional insulation layer 20*b* are removed before the absorber material layer 20*c* is patterned and structured. In alternative embodiments not shown, the absorber material layer 20*c* remains unstructured. Finally, the absorber portion 20 is finalized by depositing the passivation 22 as described above in line with the other embodiments.

Figure 6:
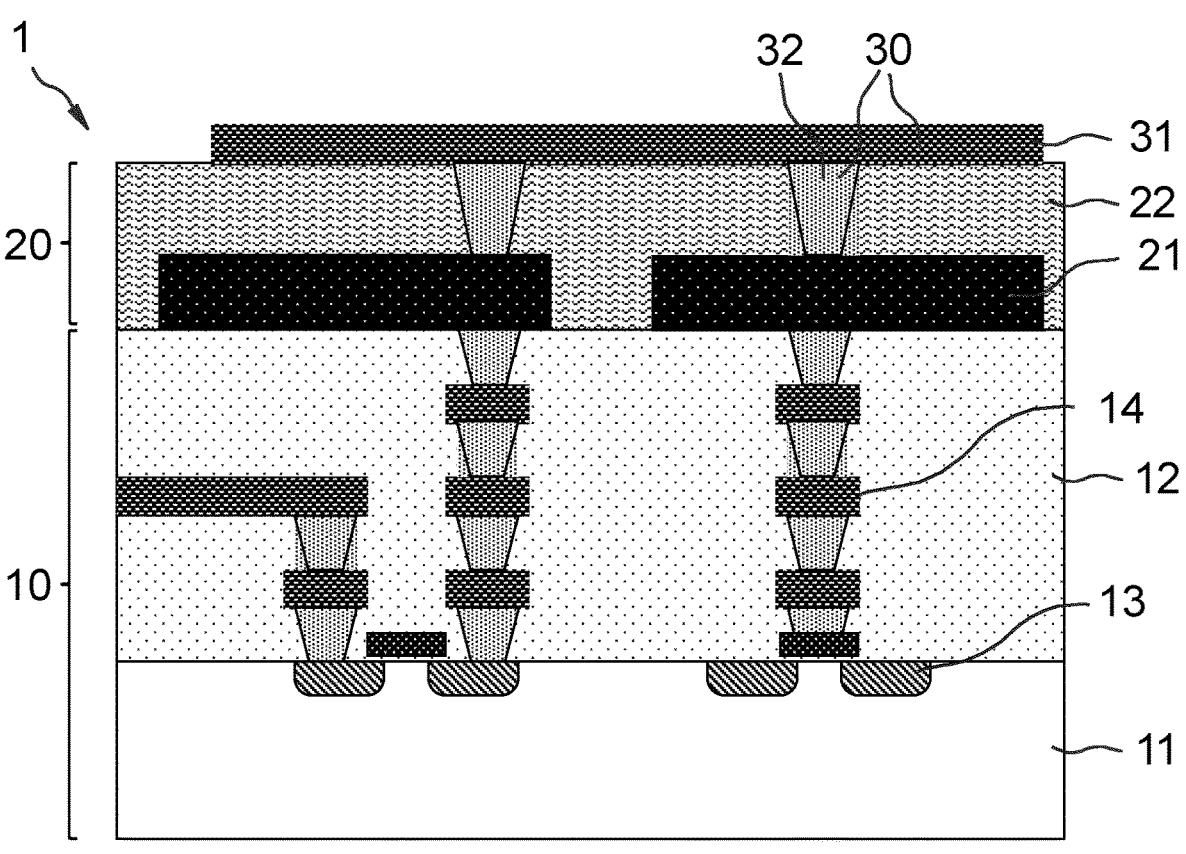
FIG. 6 shows an exemplary embodiment of an integrated detector device according to the improved concept.

FIG. 6 shows a cross-sectional schematic view of an exemplary embodiment of an integrated detector device 1 according to the improved concept. On the finalized device 1, an electrode structure 30 is arranged in order to induce charge separation or migration within the absorber material 21. To this end, an electrode 31, e.g. realized as a patterned and structured metal layer, is deposited onto the passivation 22 and electrically interconnected with the absorber elements 21 using vias 32 or metal interconnects. In alternative embodiments, the electrode 31 can be in direct physical and electrical contact with the absorber elements 21, e.g. after the passivation material is removed above the absorber elements 21.

The embodiments of the integrated detector device 1 for direct detection of X-ray photons and embodiments of its manufacturing method shown in the figures represent exemplary embodiments, therefore they do not constitute a complete list of all embodiments according to the improved concept. Actual integrated detector devices may vary from the embodiments shown in terms of additional components, shape and configuration, for instance. In particular, features shown in the various figures may be combined with each other and hence form additional embodiments according to the improved concept.

The invention claimed is:

1. An integrated detector device for direct detection of X-ray photons, the integrated detector device comprising:
   a CMOS body comprising a substrate portion and a dielectric portion arranged on a main surface of the substrate portion;
   an integrated circuit in the CMOS body having implants at or above the main surface for forming charge collectors;
   a metal structure in the dielectric portion that extends from the charge collectors to a contact surface of the dielectric portion facing away from the substrate portion;
   an absorber portion arranged on the contact surface of the dielectric portion, the absorber portion comprising an absorber element that is in electrical contact with the metal structure; and
   an electrode structure that is in direct contact with the absorber element forming an electrical contact, wherein
   the absorber element is configured to absorb X-ray photons and generate electrical charges based on the absorbed X-ray photons;
   a material of the absorber element is a metal-halide perovskite, in particular, an inorganic metal-halide perovskite such as $CsPbBr_3$, and
   the metal structure is either a via structure or a metallization level present in the backend-of-line, and/or a material of the metal structure at the contact surface is a catalyst acting as a nucleation site of a material of the absorber element or its educts.

2. The integrated detector device according to claim 1, wherein the integrated detector device is a monolithic semiconductor device.

3. The integrated detector device according to claim 1, wherein a material of the metal structure at the contact surface is a catalyst with respect to a reaction educt of a material of the absorber element.

4. The integrated detector device according to claim 1, wherein the absorber element is in direct physical contact with the contact surface.

5. The integrated detector device according to claim 1, wherein the absorber portion further comprises a passivation that at least partially surrounds the absorber element and an electrode of the electrode structure is arranged on a surface of the passivation facing away from the contact surface.

6. The integrated detector device according claim 1, wherein
   the contact surface comprises first bond pads and the absorber portion comprises a bonding surface having second bond pads that are in electrical contact with the absorber element; and
   the first bond pads are bonded to the second bond pads via a direct bonding process.

7. The integrated detector device according to claim 1, wherein the integrated detector device is free of connecting elements such as solder bumps between the CMOS body and the absorber portion.

8. The integrated detector device according to claim 1, wherein the integrated detector device is free of CdTe and CdZnTe.

9. A method of manufacturing an integrated detector device for direct detection of X-ray photons, the method comprising:
   forming a CMOS body by arranging a dielectric portion on a main surface of a substrate portion;
   forming an integrated circuit in the CMOS body having implants at or above the main surface for forming charge collectors;
   forming a metal structure in the dielectric portion that extends from the charge collectors to a contact surface of the dielectric portion facing away from the substrate portion;
   arranging an absorber portion on the contact surface of the dielectric portion by forming an absorber element that is in electrical contact with the metal structure;
   providing an electrode structure that is in direct contact with the absorber element forming an electric contact, wherein
      the absorber element is configured to absorb X-ray photons and generate electrical charges based on the absorbed X-ray photons; and
      a material of the absorber element is a metal-halide perovskite, in particular an inorganic metal-halide perovskite such as $CsPbBr_3$; and
   forming the metal structure comprises providing a via structure having a top via made of tungsten at the contact surface, and/or forming the absorber element comprises patterning, structuring and/or polishing of a material of the absorber element.

10. The method according to claim 9, wherein
   arranging the absorber portion further comprises forming a passivation that at least partially surrounds the absorber element; and
   providing the electrode structure comprises arranging an electrode on a surface of the passivation facing away from the contact surface.

11. The method according to claim 9, wherein arranging the absorber portion comprises growing, in particular selectively growing, a material of the absorber element on the contact surface, wherein a region of the metal structure at the contact surface acts as a nucleation site.

12. The method according to claim 9, wherein arranging the absorber portion comprises performing a direct bonding process between the absorber portion and the CMOS body.

13. The method according to claim 9, wherein the manufacturing method is a fully CMOS compatible process.

14. The method according to claim 9, wherein arranging the absorber portion comprises
   depositing a dielectric layer on the contact surface;
   patterning and structuring the dielectric layer to form a trench within the dielectric layer; and
   depositing the absorber element within the trench.

15. The method according to claim 9, wherein a material of the metal structure at the contact surface is a catalyst acting as a nucleation site of a material of the absorber element or its educts.

16. An integrated detector device for direct detection of X-ray photons, the integrated detector device comprising:
   a CMOS body comprising a substrate portion and a dielectric portion arranged on a main surface of the substrate portion;
   an integrated circuit in the CMOS body having implants at or above the main surface for forming charge collectors;

a metal structure in the dielectric portion that extends from the charge collectors to a contact surface of the dielectric portion facing away from the substrate portion;

an absorber portion arranged on the contact surface of the dielectric portion, the absorber portion comprising an absorber element that is in electrical contact with the metal structure; and an electrode structure that is in direct contact with the absorber element forming an electrical contact, wherein the absorber element is configured to absorb X-ray photons and generate electrical charges based on the absorbed X-ray photons, a material of the absorber element is a metal-halide perovskite, in particular, an inorganic metal-halide perovskite such as $CsPbBr_3$, and the absorber portion further comprises a passivation that at least partially surrounds the absorber element and an electrode of the electrode structure is arranged on a surface of the passivation facing away from the contact surface.

* * * * *